United States Patent
Pal

(10) Patent No.: US 8,289,711 B2
(45) Date of Patent: Oct. 16, 2012

(54) INTEGRATED THERMAL PACKAGING OF HIGH POWER MOTOR CONTROLLER

(75) Inventor: Debabrata Pal, Hoffman Estates, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 152 days.

(21) Appl. No.: 12/859,816

(22) Filed: Aug. 20, 2010

(65) Prior Publication Data
US 2012/0044646 A1    Feb. 23, 2012

(51) Int. Cl.
*H05K 7/20* (2006.01)
*F28F 7/00* (2006.01)

(52) U.S. Cl. .......... 361/702; 165/80.4; 361/699

(58) Field of Classification Search ........ 361/702
See application file for complete search history.

(56) References Cited

U.S. PATENT DOCUMENTS

| | | |
|---|---|---|
| 4,315,300 A | 2/1982 | Parmerlee et al. |
| 4,347,897 A | 9/1982 | Sumitomo et al. |
| 4,712,158 A | 12/1987 | Kikuchi et al. |
| 4,910,642 A | 3/1990 | Downing |
| 4,941,530 A | 7/1990 | Crowe |
| 4,944,344 A | 7/1990 | Crowe |
| 4,975,803 A | 12/1990 | Niggemann |
| 5,088,005 A | 2/1992 | Ciaccio |
| 5,276,587 A | 1/1994 | Ciaccio |
| 5,424,916 A * | 6/1995 | Martin ................... 361/698 |
| 5,801,924 A * | 9/1998 | Salmonson ............ 361/719 |
| 5,914,860 A * | 6/1999 | Janko ..................... 361/710 |
| 6,191,945 B1 | 2/2001 | Belady et al. |
| 6,501,653 B1 * | 12/2002 | Landsgestell et al. ...... 361/699 |
| 6,778,389 B1 * | 8/2004 | Glovatsky et al. ......... 361/690 |
| 7,177,153 B2 * | 2/2007 | Radosevich et al. ....... 361/699 |
| 7,180,736 B2 * | 2/2007 | Glovatsky et al. ......... 361/688 |
| 7,414,844 B2 * | 8/2008 | Wilson et al. ............. 361/699 |

* cited by examiner

*Primary Examiner* — Gregory Thompson
(74) *Attorney, Agent, or Firm* — Carlson, Gaskey & Olds PC

(57) ABSTRACT

According to an example provided herein, a cold plate has a surface for mounting a component thereto, a first path to flow cooling fluid therethrough in a vicinity of the surface and a housing mounted on the surface that extends from the surface. The housing has a second path attaching to the first path to flow fluid to flow through the housing wherein the housing is designed to at least partially enclose the component and wherein the component is cooled by the housing.

14 Claims, 3 Drawing Sheets

INTEGRATED THERMAL PACKAGING OF HIGH POWER MOTOR CONTROLLER

BACKGROUND OF THE INVENTION

Electronic modules used to provide electricity and controls to aircraft need cooling for efficient operation. Some electronic modules are cooled by fans or by liquids that circulate in close proximity to the modules by cooling plates in which the modules are mounted. Cooling tubes are also known to cool some electronics.

It is also well known that efficient operation of aircraft requires that the weight of the aircraft and the componentry, including electronic modules and cooling apparatus therefore be minimized.

SUMMARY OF THE INVENTION

According to an example provided herein, a cold plate has a surface for mounting a component thereto, a first path to flow cooling fluid therethrough in a vicinity of the surface and a housing mounted on the surface that extends from the surface. The housing has a second path attaching to the first path to flow fluid to flow through the housing wherein the housing is designed to at least partially enclose the component and wherein the component is cooled by the housing.

According to a further example provided herein, a cold plate has a surface having a component requiring cooling mounted thereto, a first path to flow cooling fluid therethrough in a vicinity of the surface, and, a housing mounted on the surface and extending therefrom. The housing has a second path attaching to the first path to flow fluid through the housing wherein the housing at least partially encloses the component and wherein the component is cooled by the housing.

According to an example method provided herein, a method for minimizing a size of an electronics package requiring cooling includes the steps of determining a component in the electronics package that requires cooling, providing a cooling housing for that component that at least partially encloses the component and attaches to a cooling plate, wherein the housing removes heat from the component, and mounting a part needing cooling to the housing.

These and other features of the present invention can be best understood from the following specification and drawings, the following of which is a brief description.

DETAILED DESCRIPTION OF THE PREFERRED EMBODIMENT

Figure 1:
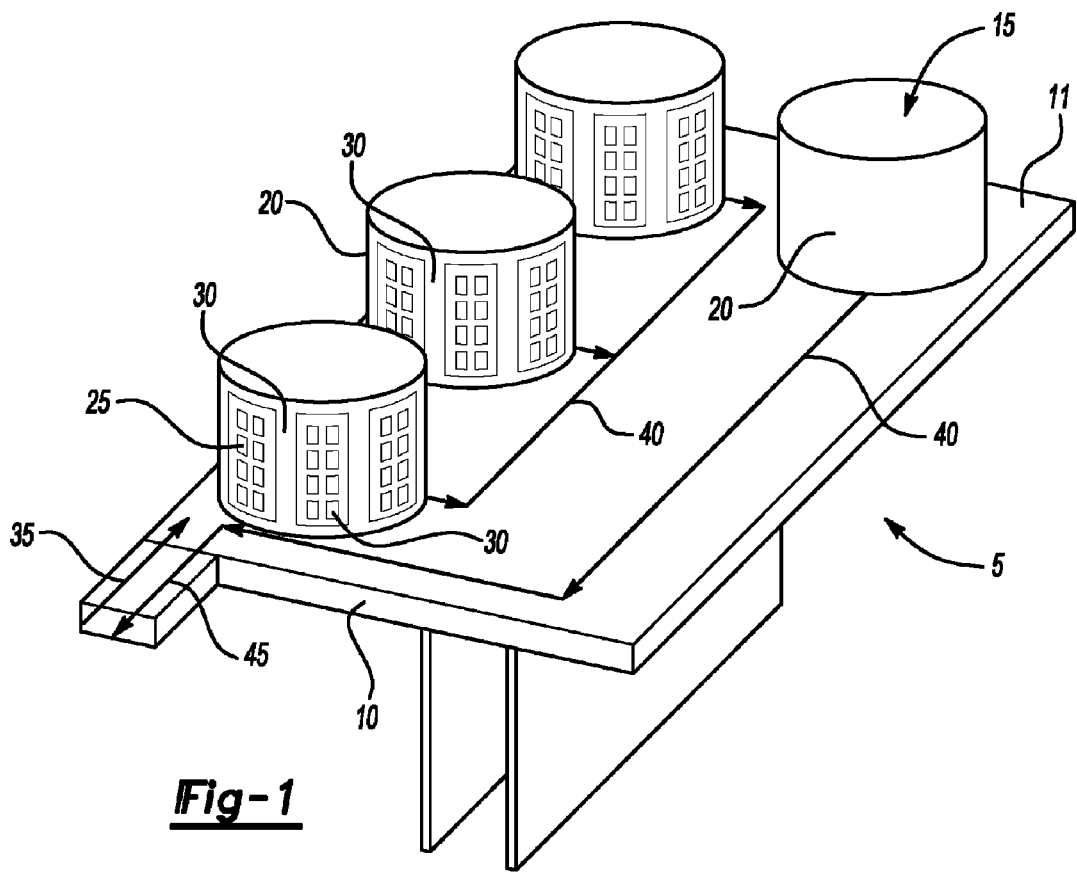
FIG. 1 shows an electronics package including a cold plate.

Referring now to FIG. 1, an electronics package 5 includes a cold plate 10 having a surface 11 upon which a plurality of electrical components 15, such as power modules, DC link capacitors, insulator gate bipolar transistors, printed wiring assemblies, inductors, or the like, are mounted thereon or there under. At least some of the electrical components 15, which may require additional cooling, are mounted to the surface 11 within a housing 20 that provides additional cooling to those components 15 as will be discussed herein. While cold plates 10 are generally planar, the cold plate described herein may have other shapes.

Each housing 20 may have one or more electrical parts 25 on its walls 30 that at least partially enclose each electrical component 15. Parts 25 may include, for instance, an inverter power module that relates to a component 15, such as an inductor, within walls 30, but may also not relate to the functionality of the component 15 housed in the housing 20. Parts, for instance may also include DC link capacitors and bus bars, etc. Though components 15 are indicated to be held within housings 20 and parts 25 are designated as those mounted on walls 30 of the housings 20, there is no limitation contemplated herein as to what those particular electrical parts or components may be.

By placing components 15 within housings 20 and by placing parts 25 on the housings 20, two functions are achieved: first, components 15 that need additional cooling receive that cooling; and second, the overall size of the cold plate 10 and/or the electronics package 5 may be reduced. By removing parts 25 from the cold plate 10 and utilizing the surface area of the walls 30 of the housing 20, the use of space on the cold plate 10 may be maximized to minimize the area of the cold plate 10. By utilizing the housing 20 as a mounting surface, cooling can be provided to both components 15 within the housing 20 and any part 25 placed on the walls 30 of the housing 20. Similarly, because the cooling is provided to those modules that most need it, the cold plate 10 depth may also be minimized.

The cold plate 10 has a fluid inlet 35, a fluid path 40 passing through the cold plate 10 and a fluid outlet, 45. The fluid path 40 carries cooling fluid received at the fluid inlet 35 to the vicinity of the surface 11 and components 15 mounted on the cold plate 10 to carry fluid that is warmed by the components 15 through the fluid outlet 45 so that the components 15 are cooled. The cold plate 10 may have fin cores (depicted in FIGS. 3 and 4) attaching to the top and bottom plates within the cold plate 10 to maximize heat absorption from the components 15. Heat dissipated by the component 15 is absorbed through the cold plate 10 and the fluid path 40 for rejection from the electronics package 5. As will be seen herein, the fluid is also transported to and through the housings 20.

Figure 2:
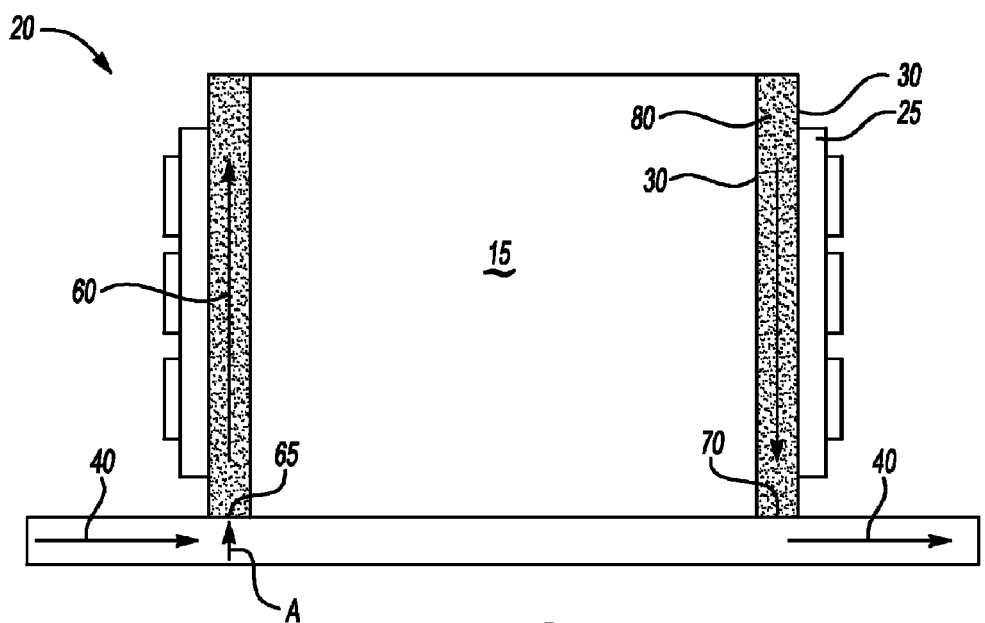
FIG. 2 shows a side view of a component of FIG. 1.
Figure 3:
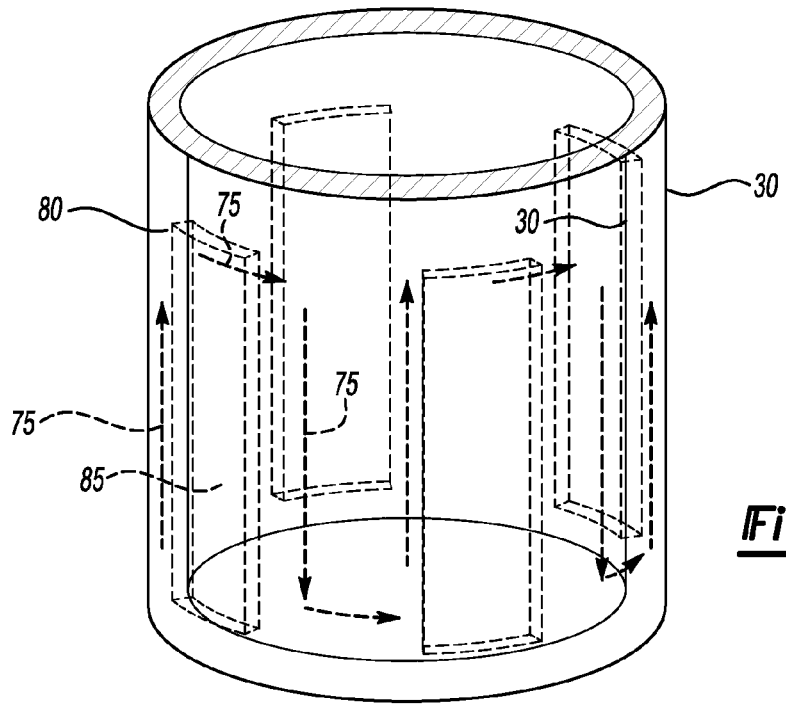
FIG. 3 shows a partially sectional view of the component of FIG. 2.

Referring now to FIGS. 2 and 3, the housing 20 in relation to the cold plate 10 is shown. The housing 20 is circular mimicking the shape 50 of component 15, in this case an examplar inductor 55 (see FIG. 4). If the component 15 had a different shape, the housing 20 would at least partially enclose that shape. Note that in FIG. 1, the housing 20 is completely enclosing a component within and in FIGS. 2 and 4, the housing 20 has no top covering the inductor 55. The housing 20 extends from and is attached to the cold plate 10 by conventional means such as brazing.

Cooling fluid passes through channels 60 that attach at a first end 65 to the fluid path 40 and a second end 70 to the fluid path 40 within the cold plate. Fluid as indicated by arrow A enters the first end 65 in the housing 20 and follows a path 75, which may be tortuous, through an interior 80 of the housing 20. Embedded fin cores 85 that absorb heat from the component 15 exchange the heat as the relatively cool fluid flows through the embedded fin cores 85. The fin cores 85 are placed in the space between the inner and outer diameters of the housing 20 in interior 80 to allow the housing 20 to provide cooling to the exemplar inductor 55 and to any part 25 disposed upon the walls 30 of the housing 20. The path 75 passing through the housing 20 may have routes that optimize cooling for components 15 within and mounted without of the housing 20.

Figure 4:
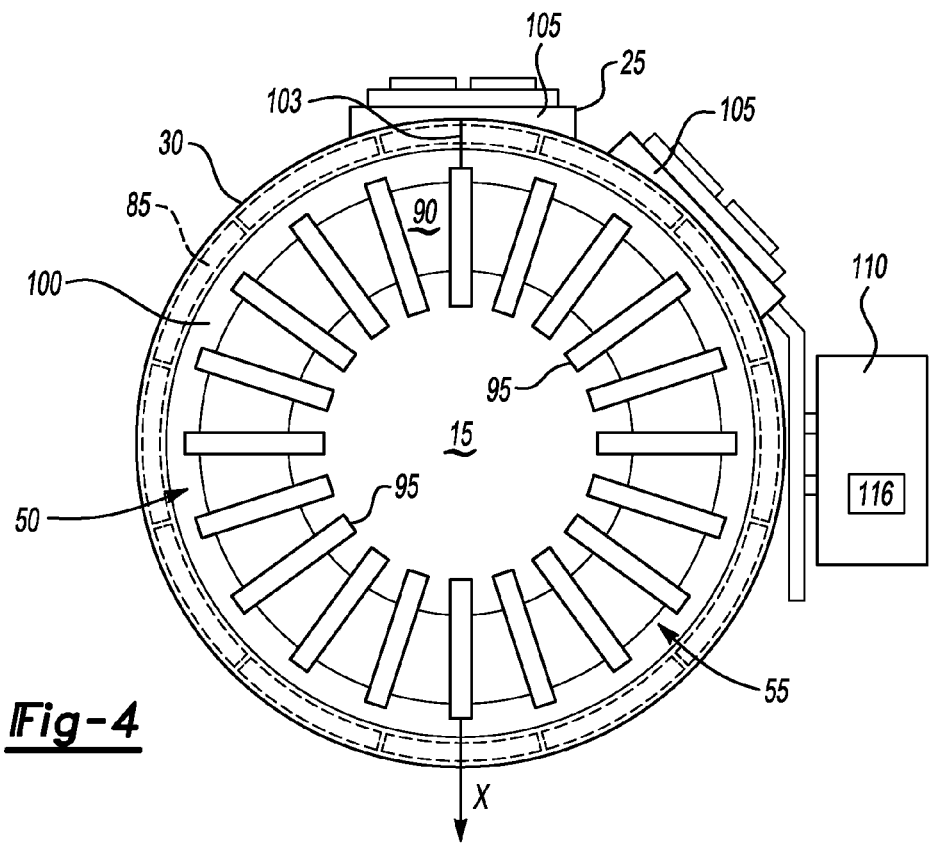
FIG. 4 shows a top view of the component of FIG. 2.

Referring now to FIG. 4, a component 15 such as an inductor 55 is shown integrally disposed within housing 20. The inductor 55 has a magnetic core 90, a plurality of windings 95 and is separated from the housing 20 by a potting compound 100. Inverter power modules 105 that are connected to the inductor and convert direct current (DC) to alternating current (AC) are disposed upon the walls 30 of the housing 20. An electrical connection 103 passes through the housing 20 and connects to the windings 95. The number of inverter power modules 105 correlate to the number of phases of AC power required. There is a DC input 110 and a DC link capacitor 116 (see FIG. 4) to smooth the input to the inverter power modules 105 and AC output is indicated by arrow X connecting to the windings 95 and passing through the inductor housing 20. The potting compound 100 conducts heat of the inductor 55 to the housing 20.

By no longer mounting the inverter power modules 105 on the cold plate 10 and mounting the inverter power modules 105 on the walls 30, space that was occupied by the inverter power modules 105 on the cold plate 10 may hold additional components 15 or may be eliminated thereby minimizing the size of the cold plate 10.

Figure 5:
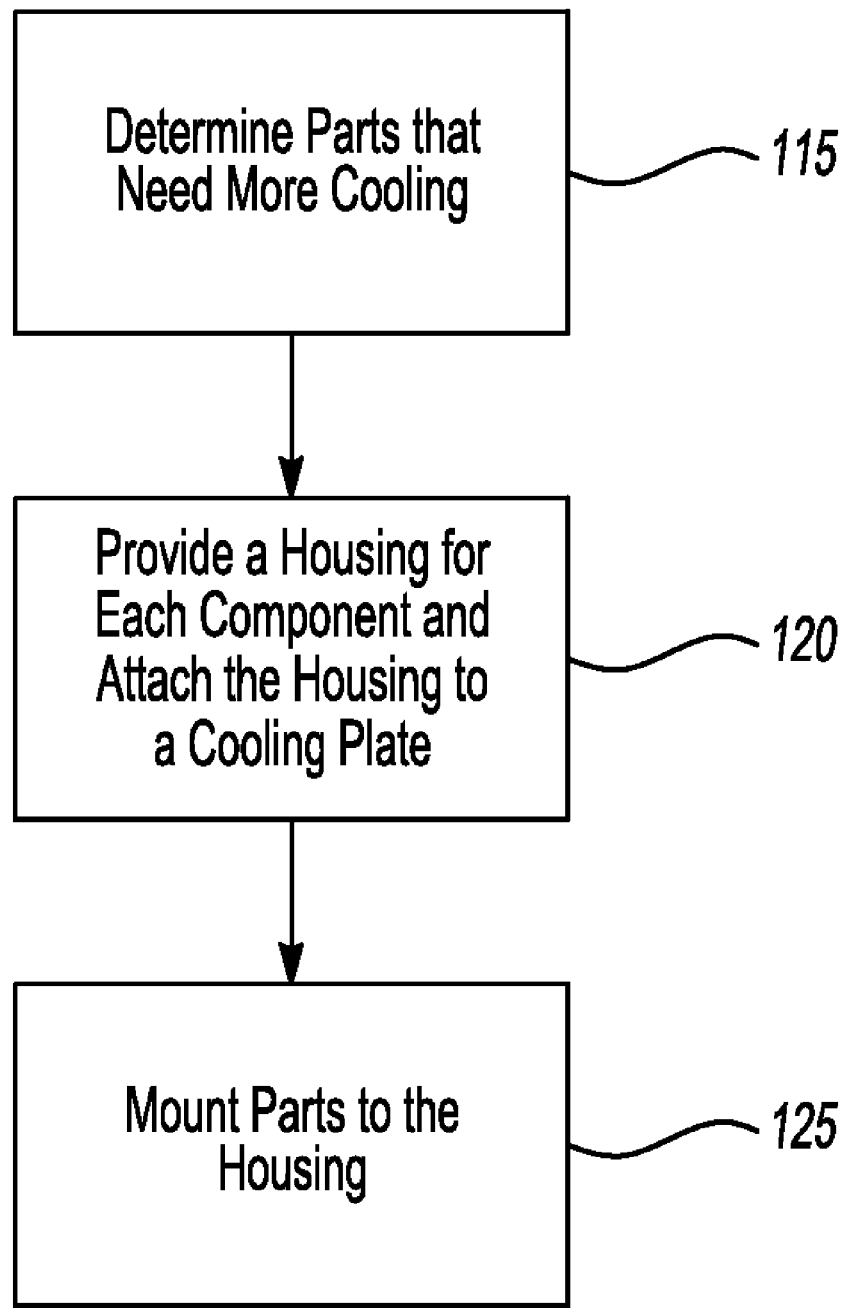
FIG. 5 shows a method for constructing the electronics package of FIG. 1.

Referring now to FIG. 5, a method of designing a smaller electronics package 5 that needs cooling is shown: components 15 that need more cooling are identified (step 115); a housing 20 that at least partially enclosed that component 15 is provided for that component 15 (step 120); and, parts 25 are attached to the walls 30 (step 125). The parts 25 may be attached before or after the housing is attached to the cold plate 10.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A cold plate comprising:
a surface of a body for mounting a component to said surface,
a first path to flow cooling fluid through said body in a vicinity of said surface and
a housing having an inner diameter and an outer diameter and a space in between said inner and outer diameter, said housing mounted on said surface and extending therefrom, said housing having a second path attaching to said first path to flow fluid through said housing, wherein said housing is designed to at least partially enclose said component, wherein said component is cooled by said housing wherein said second path includes fin cores disposed within said space of said housing and wherein said housing is for contact with said component.

2. The cold plate of claim 1 wherein said housing further comprises an outer wall for mounting an electrical part wherein said electrical part is cooled by said housing.

3. The cold plate of claim 1 wherein said component has a first shape and said housing is designed with a second shape that mimics said first shape.

4. The cold plate of claim 1 wherein said second path is tortuous.

5. A cold plate comprising:
a surface having a component requiring cooling mounted thereto,
a first path to flow cooling fluid therethrough in a vicinity of said surface for cooling said surface, and,
a housing having an inner diameter and an outer diameter and a space in between said inner and outer diameter, said housing mounted on said surface and extending therefrom, said housing having a second path attaching to said first path to flow fluid through said housing for cooling said housing, wherein said housing at least partially encloses said component and wherein said component is cooled by said housing wherein said second path includes fin cores disposed within said space of said housing.

6. The cold plate of claim 5 wherein said housing further comprises an outer wall for mounting a part requiring cooling wherein said part is cooled by said housing.

7. The cold plate of claim 5 wherein said component has a first shape and said housing has a second shape that mimics said first shape.

8. The cold plate of claim 5 wherein said second path is tortuous.

9. The cold plate of claim 5 wherein said component is an inductor.

10. The cold plate of claim 6 wherein said part is an inverter power module and said component is an inductor.

11. The cold plate of claim 9 wherein said inductor further comprises a coil, windings disposed about said coil and potting compound disposed between said coil and said housing.

12. The cold plate of claim 5 wherein potting compound is disposed between said component and said housing.

13. The cold plate of claim 5 wherein said component has a first shape and said housing has a second shape that mimics said first shape and is in close proximity to said first shape.

14. The cold plate of claim 5 wherein said component is in contact with said housing.

* * * * *